(12) United States Patent
Neumayer et al.

(10) Patent No.: US 9,112,068 B2
(45) Date of Patent: Aug. 18, 2015

(54) LASER DOPING OF CRYSTALLINE SEMICONDUCTORS USING A DOPANT-CONTAINING AMORPHOUS SILICON STACK FOR DOPANT SOURCE AND PASSIVATION

(71) Applicant: International Business Machines Corporation, Armonk, NY (US)

(72) Inventors: Deborah A. Neumayer, Danbury, CT (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/646,120

(22) Filed: Oct. 5, 2012

(65) Prior Publication Data
US 2014/0096820 A1 Apr. 10, 2014

Related U.S. Application Data

(63) Continuation of application No. 13/645,926, filed on Oct. 5, 2012.

(51) Int. Cl.
*H01L 31/0224* (2006.01)
*H01L 31/068* (2012.01)
*H01L 31/0747* (2012.01)
*H01L 31/18* (2006.01)

(52) U.S. Cl.
CPC ...... *H01L 31/022425* (2013.01); *H01L 31/068* (2013.01); *H01L 31/0747* (2013.01); *H01L 31/1804* (2013.01); *Y02E 10/547* (2013.01)

(58) Field of Classification Search
USPC .......................................... 136/261; 257/433
See application file for complete search history.

(56) References Cited

U.S. PATENT DOCUMENTS

| | | | |
|---|---|---|---|
| 4,468,853 A | 9/1984 | Morita et al. | |
| 4,762,803 A | 8/1988 | Sato et al. | |
| 5,229,322 A | 7/1993 | Chu et al. | |
| 6,429,037 B1 | 8/2002 | Wenham et al. | |
| 7,858,427 B2 | 12/2010 | Rana | |
| 8,088,675 B2 | 1/2012 | Rana et al. | |
| 2004/0182433 A1 | 9/2004 | Terakawa et al. | |
| 2006/0162770 A1* | 7/2006 | Matsui et al. | 136/263 |
| 2008/0241986 A1 | 10/2008 | Rohatgi et al. | |
| 2009/0211623 A1 | 8/2009 | Meier et al. | |
| 2009/0215218 A1 | 8/2009 | Meier et al. | |
| 2010/0068415 A1 | 3/2010 | Cabarrocas et al. | |
| 2011/0223708 A1 | 9/2011 | Sinha | |
| 2012/0167966 A1 | 7/2012 | Hu et al. | |
| 2012/0227805 A1 | 9/2012 | Hermle et al. | |

FOREIGN PATENT DOCUMENTS

| | | |
|---|---|---|
| JP | 59056775 A | 4/1984 |
| JP | 5326989 A | 12/1993 |

* cited by examiner

*Primary Examiner* — Shannon Gardner
(74) *Attorney, Agent, or Firm* — Ryan, Mason & Lewis, LLP (57) ABSTRACT

Techniques and structures for laser doping of crystalline semiconductors using a dopant-containing amorphous silicon stack for dopant source and passivation. A structure includes a crystalline semiconductor having at least one surface, a doped crystalline region disposed in at least one selected area of the semiconductor surface, and a dopant-containing amorphous silicon layer stack containing a same dopant as present in the doped crystalline region on at least a portion of the semiconductor surface outside the selected area, wherein the dopant-containing amorphous silicon layer stack passivates the portion of the semiconductor surface on which it is disposed.

13 Claims, 11 Drawing Sheets

LASER DOPING OF CRYSTALLINE SEMICONDUCTORS USING A DOPANT-CONTAINING AMORPHOUS SILICON STACK FOR DOPANT SOURCE AND PASSIVATION

CROSS-REFERENCE TO RELATED APPLICATIONS

This application is a continuation of U.S. patent application Ser. No. 13/645,926, filed Oct. 5, 2012, and incorporated by reference herein.

FIELD OF THE INVENTION

Embodiments of the invention generally relate to electronic devices and, more particularly, to doping semiconductor solar cell devices.

BACKGROUND OF THE INVENTION

Challenges exist in obtaining solar cell back surface fields (bsfs) on a low-to-moderate thermal budget (for example, <400-800 C) in p-type silicon (Si). Aluminum-(Al-)based bsfs (fabricated by >800 C alloying of an Al-paste or metallic Al layer) can have the desired several-micron thickness, but can be difficult to form at temperatures below 800 C due to the low solid solubility of Al in Si. While boron (B) dopants have much higher solid solubilities in Si, the long periods at high temperatures (for example, 900-1050 C) required for sufficient B diffusion can degrade the bulk lifetime of the Si substrate and/or lead to dopant clustering in ways that can produce misfit dislocations.

Some back surface field functionality can be provided in heterojunction with intrinsic thin layer (HIT) cells with the use of intrinsic amorphous silicon (i-aSiH)/doped-aSiH stacks on Si substrates (for example, p-Si(substrate)/i-aSiH/p-aSiH and n-Si(substrate)/i-aSiH/n-aSiH)), but these cells can be difficult to fabricate due to the narrow process window for providing i-aSiH/doped-aSiH stacks with aSiH layers thick enough to provide good passivation yet thin enough to provide sufficient tunneling current to the back surface metallurgy.

Accordingly, a need exists for a low-temperature, easy-to-integrate technique for forming B-doped back surface fields in p-type Si.

SUMMARY OF THE INVENTION

In one aspect of the invention, a structure can include a crystalline semiconductor having at least one surface, a doped crystalline region disposed in at least one selected area of the semiconductor surface, and a dopant-containing amorphous silicon layer stack containing a same dopant as present in the doped crystalline region on at least a portion of the semiconductor surface outside the selected area, wherein the dopant-containing amorphous silicon layer stack passivates the portion of the semiconductor surface on which it is disposed.

In another aspect of the present invention, techniques for laser doping of crystalline semiconductors using a dopant-containing amorphous silicon stack for dopant source and passivation are provided. An exemplary method for forming at least one doped, conductive crystalline region on a surface of a crystalline semiconductor layer can include steps of forming a dopant-containing amorphous silicon layer stack on at least one portion of a surface of a crystalline semiconductor layer, and irradiating a selected area of the dopant-containing amorphous silicon layer stack, wherein the selected area of the dopant-containing amorphous silicon layer stack interacts with an upper portion of the underlying crystalline semiconductor layer to form a doped, conductive crystalline region, and each non-selected area of the dopant-containing amorphous silicon layer stack remains intact on the at least one portion of the surface of the crystalline semiconductor layer.

In yet another aspect of the present invention, techniques for forming a doped, conductive crystalline region on a surface of a crystalline semiconductor layer can include steps of forming a dopant-containing amorphous silicon layer stack on at least one portion of a surface of a crystalline semiconductor layer, and irradiating the dopant-containing amorphous silicon layer stack, wherein the dopant-containing amorphous silicon layer stack interacts with an upper portion of the underlying crystalline semiconductor layer to form a blanket doped, conductive crystalline region.

These and other objects, features and advantages of the present invention, particularly those relating to improved solar cell structures and fabrication methods, will become apparent from the following detailed description of illustrative embodiments thereof, which is to be read in connection with the accompanying drawings.

BRIEF DESCRIPTION OF THE DRAWINGS

FIG. 9A through FIG. 9I are cross-section view diagrams illustrating an example process schematic for forming a solar cell incorporating an example embodiment of the invention;

DETAILED DESCRIPTION OF EMBODIMENTS

As described herein, an aspect of the present invention includes laser doping of crystalline semiconductors. At least one embodiment of the invention includes creating heavily-doped, conductive crystalline regions in selected areas of a surface of a crystalline base semiconductor layer by locally laser-melting a dopant-source overlayer stack containing doped amorphous silicon (for example, doped-aSiH in an i-aSiH(bottom)/doped-aSiH(top) bi-layer).

As further detailed herein, the constituents of an i-aSiH/doped-aSiH stack in laser-irradiated regions (dopants plus matrix in which the dopants are contained) can largely remain in the structure after being converted to crystalline form. Additionally, the laser-melted regions can be blanket or patterned (dots, lines, etc.). For the case of patterned features, the doped amorphous silicon stack remains in the structure (between the laser irradiated regions) as a passivant. Also, in at least one embodiment of the invention, the laser melting can simultaneously pattern (form openings in) various other layers (for example, dielectric layers) over the dopant-containing layers.

Further, the techniques detailed herein can be used and/or implemented in connection with any structure (particularly silicon solar cell structures) in which heavily doped crystalline layers are needed. Additionally, such techniques can be implemented in cases where there exists a need or desire to avoid high temperature (for example, greater than 250-400 C) processing.

As also described herein, at least one embodiment of the invention includes a structure (for example, a solar cell structure) containing a crystalline semiconductor having a surface in which heavily doped crystalline regions are disposed in a surrounding surface region of a relatively lightly-doped semiconductor, wherein the lightly-doped semiconductor in the field region is passivated with an amorphous silicon layer stack containing the same dopant as present in the heavily doped region.

As noted below, at least one embodiment of the invention includes laser doping using passivating i-aSiH(bottom)/B-doped p-aSiH(top) bi-layer stacks as dopant sources, wherein the i-aSiH layer passivates the Si surface and the B-doped p-aSiH layer provides a source of B dopant to the irradiated area.

Figure 1A:
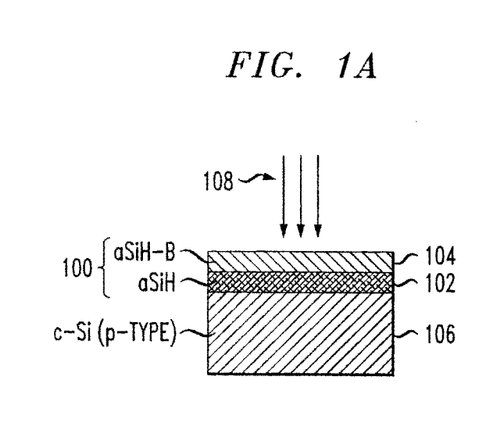
FIG. 1A through FIG. 1C are cross-section view diagrams illustrating an example process schematic for using a dopant-containing amorphous silicon layer stack to form localized doped crystalline regions, according to an embodiment of the invention.
Figure 1B:
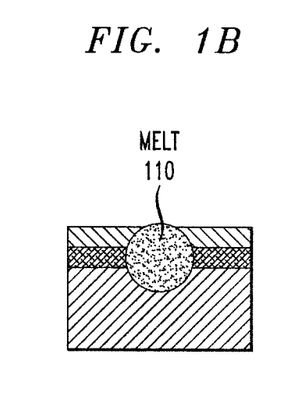
Figure 1C:
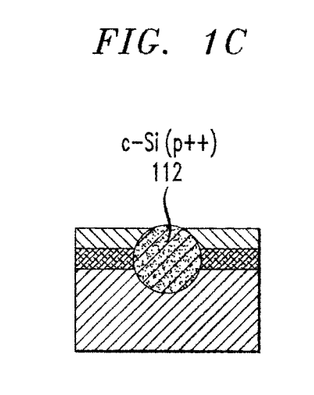

FIG. 1A through FIG. 1C are cross-section view diagrams illustrating an example process schematic for using a dopant-containing amorphous silicon layer stack to form localized laser doped crystalline regions. FIG. 1A depicts dopant-containing amorphous silicon layer stack 100 which includes an amorphous i-aSiH layer 102 and a B-doped p-aSiH layer 104 disposed on an underlying Si substrate 106 that is irradiated by patterned radiation 108. Patterned radiation 108 is typically provided by one or more pulses of a pulsed laser (pulse length <100 nanoseconds (ns)) so as to reduce thermal diffusion and bulk substrate heating. FIG. 1B shows locally melted region 110 (which includes the irradiated portion of stack 100 as well as an upper portion of substrate 106 below it) produced by patterned radiation 108. While region 110 is melted, B dopant diffuses from the source layer 102 portion of the melt into the substrate 106 portion of the melt. FIG. 1C shows the melted/diffused irradiated region 110 after crystallization into laser-doped crystalline region 112, where the crystallization has been templated by the underlying crystalline substrate 106. Also, the i-aSiH/B-doped p-aSiH (102/104) layer stack remains as a passivant in the non-irradiated regions.

The laser doping process illustrated in FIG. 1A through FIG. 1C can alternatively be implemented with one or more overlayers disposed on the dopant source layer stack. Such overlayers might include antireflection coatings (ARCs), as well as other dielectric and/or transparent reflector or barrier layers (such as $SiO_2$ and/or SiN).

Figure 2A:
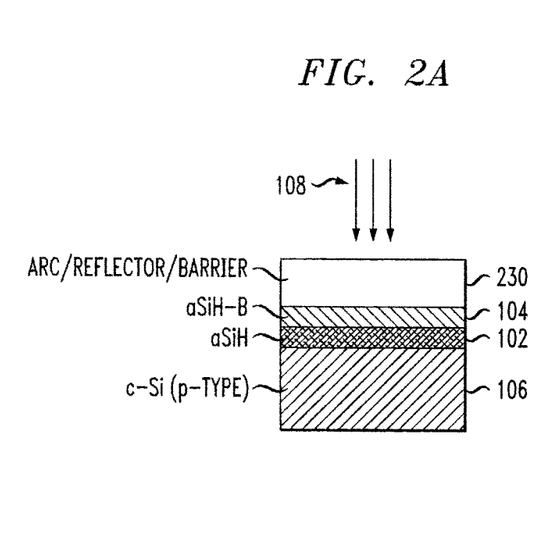
FIG. 2A through FIG. 2C are cross-section view diagrams illustrating an example process schematic for using an over-layer-coated dopant-containing amorphous silicon layer stack to form localized doped crystalline regions, according to an embodiment of the invention.
Figure 2B:
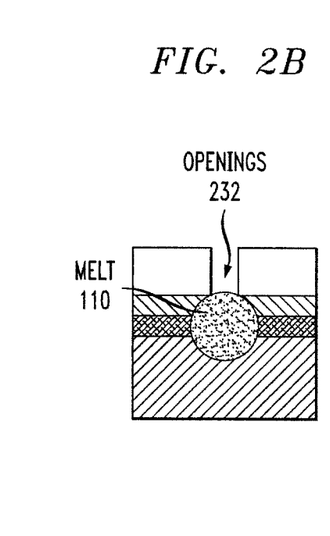
Figure 2C:
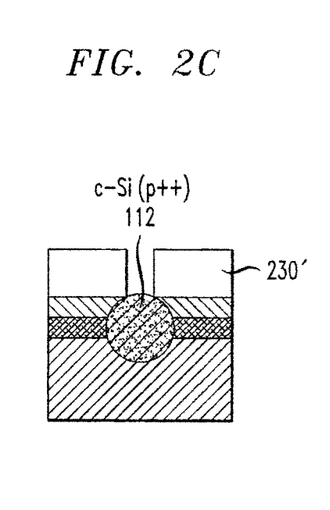

FIG. 2A through FIG. 2C are cross-section view diagrams illustrating an example process schematic with a dielectric overlayer coating or layer stack 230, according to an embodiment of the invention. In this case, the patterned laser irradiation 108 that induces the i-aSiH/B-doped p-aSiH (102/104) melting also opens the overlayer to form openings 232 in patterned overlayer 230', as illustrated in FIG. 2B. FIG. 2C shows melted/diffused irradiated region 110 after crystallization into laser-doped crystalline region 112, where the crystallization has been templated by the underlying crystalline substrate 106. As before, the i-aSiH/B-doped p-aSiH (102/104) layer remains as a passivant in the non-irradiated regions. It should be noted that the same overlayer stack 230 might function both as an ARC during laser processing (where it can produce an increase in the absorption of the laser) and a reflection-enhancing layer when disposed in a completed solar cell, for example, between a Si substrate back surface and Al back contact layer.

Figure 3A:
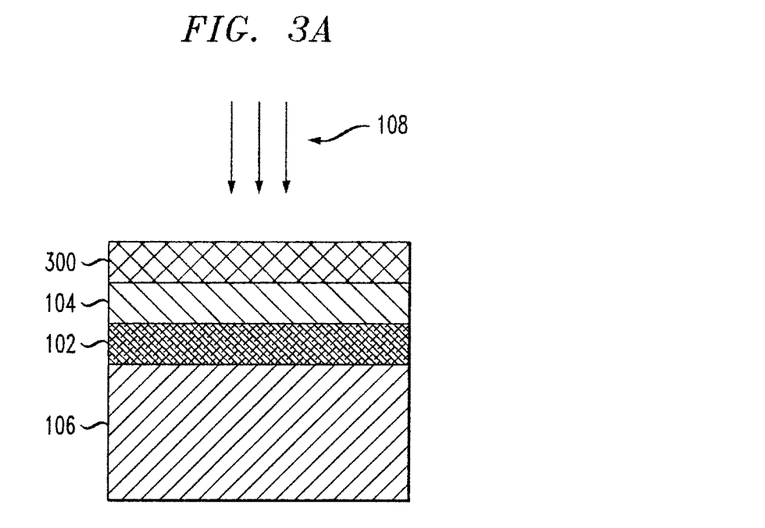
FIG. 3A and FIG. 3B are cross-section view diagrams illustrating a configuration of overlayers that may be used in combination with a dopant-containing amorphous silicon layer stack to form localized doped crystalline regions, according to an embodiment of the invention.
Figure 3B:
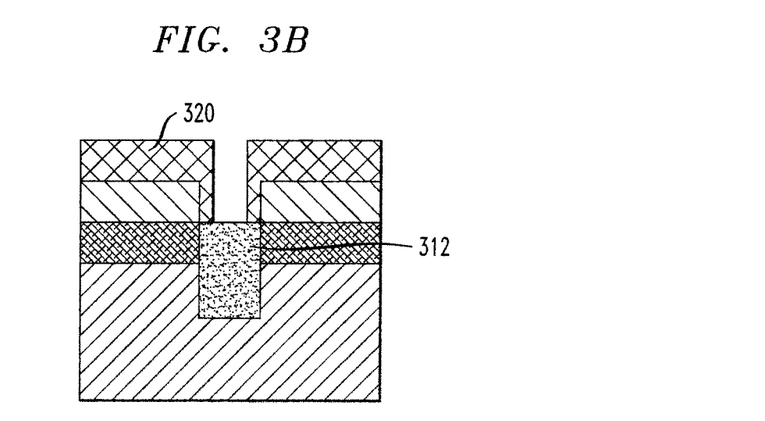
Figure 4A:
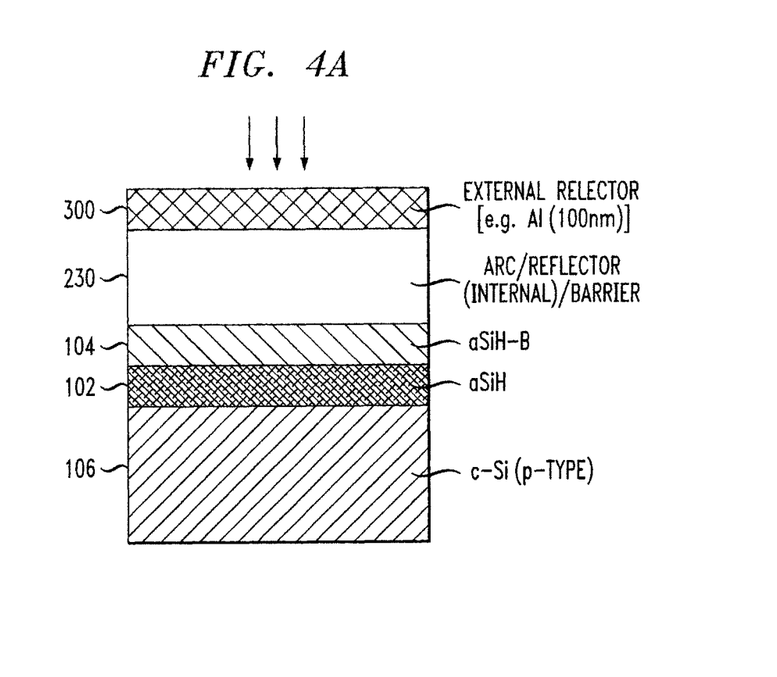
FIG. 4A and FIG. 4B are cross-section view diagrams illustrating an additional configuration of overlayers that may be used in combination with a dopant-containing amorphous silicon layer stack to form localized doped crystalline regions, according to an embodiment of the invention.
Figure 4B:
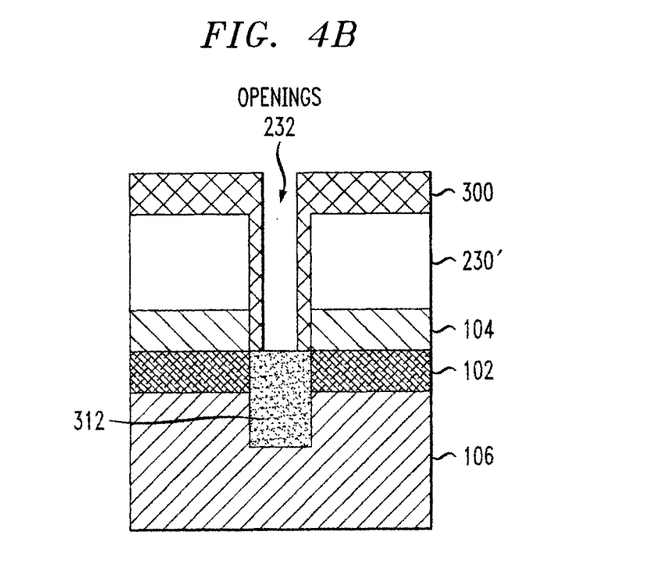

FIG. 3A and FIG. 3B as well as FIG. 4A and FIG. 4B are cross-section view diagrams illustrating two additional configurations of overlayers that may be used in combination with a dopant-containing amorphous silicon layer stack to form localized laser-doped crystalline regions, according to an embodiment of the invention. In a first additional configuration, a metallic overlayer 300 (for example, Al) is disposed on a structure (such as depicted in FIG. 1A), as shown in FIG. 3A. Patterned irradiation 108 then forms a melted region (such as described in connection with FIG. 1 and/or FIG. 2) which crystallizes into localized doped crystalline region 312, as shown in FIG. 3B, where the crystallization has been templated by the underlying crystalline substrate 106. Metallic overlayer 300 is typically removed in the irradiated area, but reflowed at edges of the irradiated area to make reflowed edge contacts 320 with the laser doped crystalline region 312.

In a second additional configuration, a metallic overlayer 300 (for example, Al) is disposed on the structure (such as depicted in FIG. 2A), as shown in FIG. 4A. Patterned irradiation 108 then forms a melted region (as detailed above), which crystallizes into localized doped crystalline region 312, as shown in FIG. 4B, where the crystallization has again been templated by the underlying crystalline substrate 106. Also, the patterned laser irradiation 108 that induces the i-aSiH/B-doped p-aSiH (102/104) melting opens/partitions overlayer 230 to form openings 232 and patterned overlayer 230'. As noted in FIG. 3B above, metallic overlayer 300 is typically removed in the irradiated area, but reflowed at edges of the irradiated area to make reflowed edge contacts 320 with the laser doped crystalline region 312.

The presence of metallic overlayers in the stack before laser processing can reduce peripheral heating/collateral damage to the dopant-containing amorphous silicon stack 102/104 at the edges of the irradiated area for cases in which the patterned laser radiation has a spatially non-uniform intensity or fluence profile that is high at the center and low at the edges. This can occur because the Al is only opened in the high fluence center portion of the irradiated region, resulting in an aperture or mask for transmission into the substrate that is smaller than the laser spot dimensions. Low fluence radiation outside of the center region can be efficiently reflected by the remaining Al, thus reducing heat-induced depassivation effects at the spot edges. While incorporating Al into the stack may include an extra step for certain applications (and thus a cost adder), it would not necessarily include an extra step in process flows in which an Al deposition step after laser processing can be replaced by one before laser processing.

It should be appreciated by one skilled in the art that while FIGS. 1 through 5 depict the case of i-aSiH/doped-aSiH stack containing B, implementation of the invention with other passivating amorphous stacks is also contemplated. For example, the i-aSiH/doped-aSiH stack may include alternative dopants (of either the same or opposite doping type; for example, phosphorous (P) being an example of an opposite doping type), as well as carbon (C) and/or germanium (Ge) replacing some or all of the Si in the aSiH and doped-aSiH layers, as well as additional doped and undoped aSiH layers. In addition, it should also be noted that the materials of the amorphous i-aSiH/doped-aSiH stack can include embedded nanocrystalline or microcrystalline semiconductor regions, that is, the term "amorphous" should be taken to include the purely amorphous phase as well as the amorphous phase with embedded nanocrystalline or microcrystalline regions. Likewise, while FIGS. 1 through 5 depict the case of a crystalline silicon substrate, the substrate may include or comprise other semiconductors (and/or layers of other semiconductors) such as Ge and/or SiGe alloys.

FIG. 5A through FIG. 5G include cross-section view diagrams illustrating examples of different solar cell structures in which the localized laser doped crystalline regions may be incorporated as localized bsfs, in accordance with at least one embodiment of the invention. The solar cells of FIG. 5A through FIG. 5G are formed with p-type Si substrates 406, and have a generic front structure 410 that includes selective emitter with lightly doped n-type regions 422 and heavily doped n-type regions 424. The depicted solar cells additionally include ARC 426 and a front conductive finger/bus grid 428. As would be appreciated by one skilled in the art, alternative front structures may also be employed.

Figure 5A:
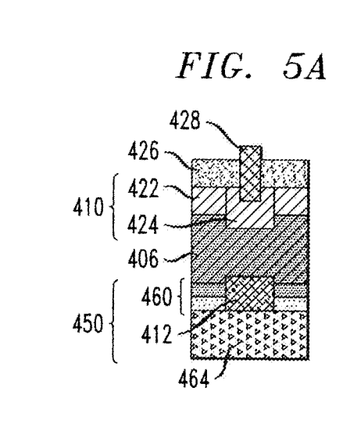
FIG. 5A through FIG. 5G are cross-section view diagrams illustrating examples of different solar cell structures in which localized crystalline doped regions may be incorporated as localized bsfs, according to an embodiment of the invention.

Further, in FIG. 5A through FIG. 5G, back structures 450 include heavily doped p-type crystalline localized laser bsf regions 412 (typically in a pattern of separated dots, but alternatively a pattern of grid lines), dopant-containing amorphous silicon layer stack 460 that also provides a passivation function, and a metallic back contact layer (for example, Al). In the structure of FIG. 5A, the metallic back contact layer 464 is blanket and directly on both the local bsf 412 and amorphous silicon stack 460.

Figure 5B:
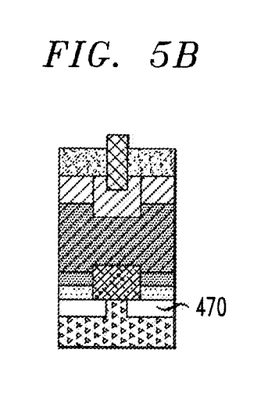

The structure of FIG. 5B is similar to the structure of FIG. 5A, but includes a thin barrier layer 470 (for example, 15 nanometers (nm) of SiN or $Al_2O_3$ deposited by plasma-enhanced chemical vapor deposition (PECVD)) patterned with contact openings under blanket metallic back contact layer 464 to prevent contact layer/amorphous stack reaction.

Figure 5C:
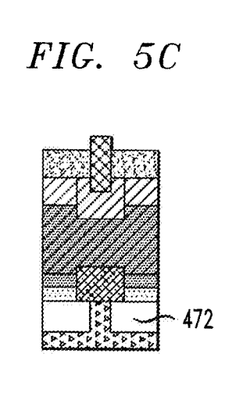
Figure 5D:
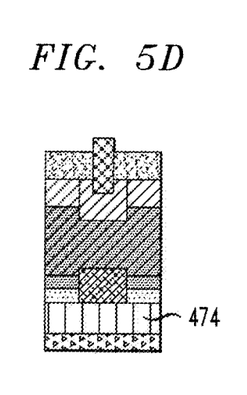
Figure 5E:
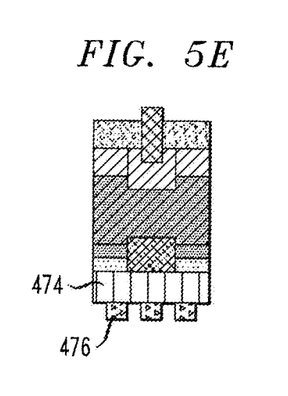
Figure 5F:
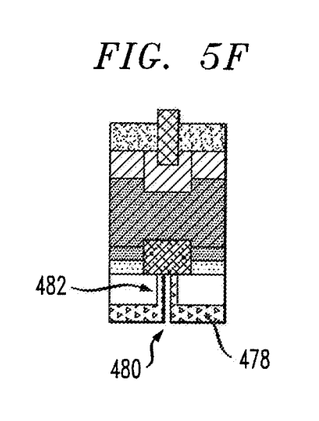
Figure 5G:
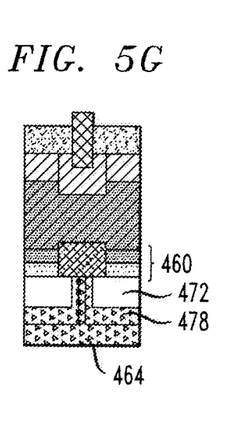

As would be appreciated by one skilled in the art, internal optical reflectivity at the Si side of a Si/Al interface can be significantly increased by inserting a transparent layer of a suitably selected refractive index and thickness between the Si and the Al; a high internal reflectivity is desirable for high efficiency cells because photons not absorbed during a first pass through the cell substrate have a second chance to be absorbed when reflected back into the cell. The structure of FIG. 5C is similar to that of FIG. 5B, but with the substitution of patterned (typically dielectric) back layer stack 472 having a thickness suitable for functioning as a reflector layer as well as a barrier (for example, SiN(15 nm)/$SiO_2$ (90 nm) or $SiO_2$ (110 nm) alone). The structure of FIG. 5D utilizes a blanket transparent conductive reflector layer 474 (for example, 80 nm of Al-doped ZnO or $SnO_2$-containing $In_2O_3$) under blanket metallic back contact layer 464. This structure has the advantage of providing a barrier/reflector function without the need for contact open patterning. The structure of FIG. 5E is similar to that of FIG. 5D except blanket metallic conductor layer 464 is replaced by grid-patterned metallic contact layer 476. The structure of FIG. 5F is similar to the structure of FIG. 5C, except that blanket metallic contact layer 464 is replaced by patterned metallic contact layer 478 with opening 480 above localized bsf 412 and reflowed edge contacts 482. The structure of FIG. 5G is identical to that of FIG. 5F, except that it further includes both back contact layer 478 and back contact layer 464.

The processes of FIGS. 1-4 may also be used to form n-type localized bsfs in n-type Si substrates if p-type dopant-containing source layer stack 102/104 is replaced with an n-type dopant-containing source layer stack. Likewise, solar cell structures analogous to those shown in FIG. 5A through FIG. 5G may alternatively be fabricated with n-type Si substrates. In such an instance, p-type dopant-containing source layer stack 102/104 would be replaced with an n-type dopant-containing source layer stack, p-type localized laser bsf 412 would be replaced with an n-type localized laser bsf, and n-type emitter 440/442 would be replaced with a p-type emitter.

While FIGS. 1 through 5 show patterned (or localized) embodiments of the invention, it is noted herein that aspects of the invention may be implemented in large-area (for example, blanket) modes as well. For instance, a blanket laser BSF embodiment of the invention can be implemented on a Si substrate by irradiating blanket regions of a dopant-containing amorphous Si layer stack disposed on a Si substrate having the same dopant type. The irradiation can be performed with large-area (for example, 1×1 square centimeters ($cm^2$)) laser spots (as shown in FIG. 6) or in a rastered mode in which a small-area spot (for example, 50 μm diameter, though line shaped spots are also possible) is scanned so as to completely cover the desired area (as shown in FIG. 7).

Figure 6A:
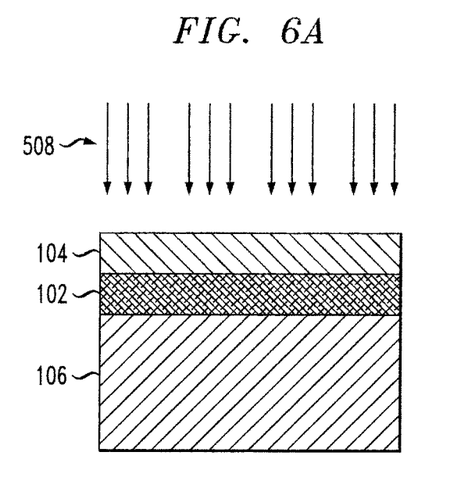
FIG. 6A and FIG. 6B are cross-section view diagrams illustrating a first example process schematic for using a dopant-containing amorphous silicon layer stack to form a blanket doped crystalline region, according to an embodiment of the invention.
Figure 6B:
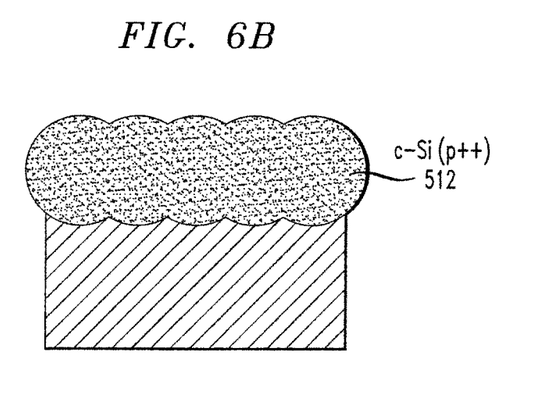

Specifically, FIG. 6A depicts, in cross-section view a starting structure for implementation of a blanket laser bsf on p-type substrate 106 using a p-doped aSiH stack (104/102). The structure of FIG. 6A is irradiated with large-area irradiation 508, resulting in doped conductive crystalline region 512, as shown in FIG. 6B. Large-area irradiation 508 is typically provided by one or more pulses of a pulsed laser (pulse length <100 ns) so as to reduce thermal diffusion and bulk substrate heating. Substrates larger than the lateral dimensions of irradiation 508 may be irradiated, for example, in a step and repeat mode. In a typical example of step and repeat irradiation, the step size would be comparable to the lateral dimensions of irradiated region.

Figure 7A:
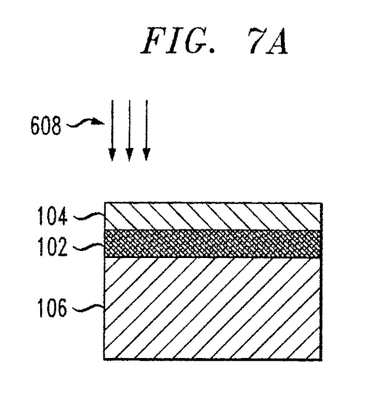
FIG. 7A through FIG. 7E are cross-section view diagrams illustrating a second example process schematic for using a dopant-containing amorphous silicon layer stack to form a blanket doped crystalline region, according to an embodiment of the invention.
Figure 7B:
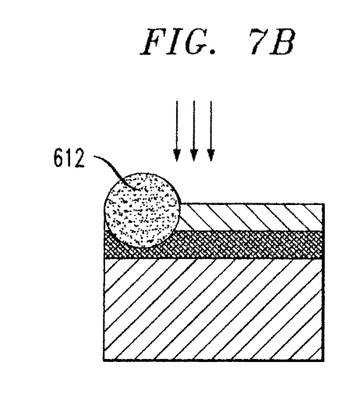
Figure 7C:
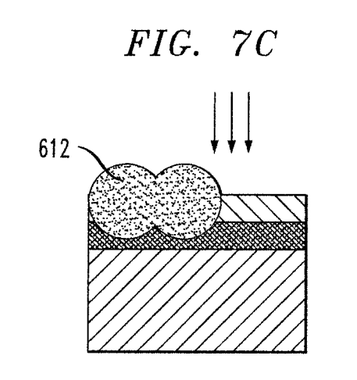
Figure 7D:
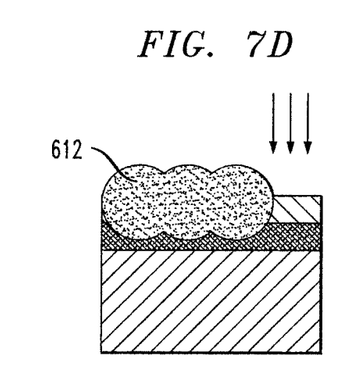
Figure 7E:
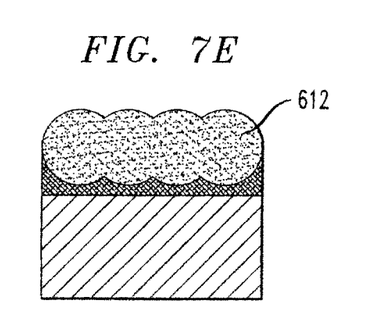

Accordingly, FIG. 7A through FIG. 7E include cross-section view diagrams illustrating an example process schematic for fabricating blanket laser back surface field in a rastered mode. Specifically, FIG. 7A depicts a starting structure for implementation of a blanket laser bsf on p-type substrate 106 using a p-aSiH stack (102/104). The structure of FIG. 7A is irradiated with spot irradiation 608, resulting in doped conductive crystalline region 612, as shown in FIG. 7B. FIG. 7B through FIG. 7D show successive stages of the process as spot irradiation 608 is scanned or rastered to enlarge the size of region 612 to its final size shown in FIG. 7E. Spot irradiation 608 is typically provided by a pulsed laser (pulse length <100 ns) so as to reduce thermal diffusion and bulk substrate heating. It is noted that the irradiated regions provided by sequential pulses of spot irradiation 608 would typically have substantial overlap, and that such rastered irradiation may be viewed as a form of step and repeat irradiation implemented with a step size significantly smaller than the spot size.

Figure 8A:
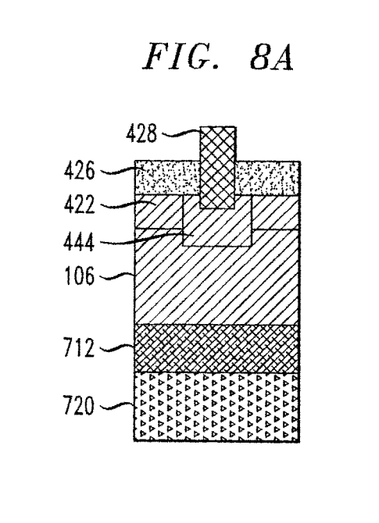
FIG. 8A through FIG. 8C are cross-section view diagrams illustrating examples of different solar cell structures incorporating blanket bsfs formed according to an embodiment of the invention.
Figure 8B:
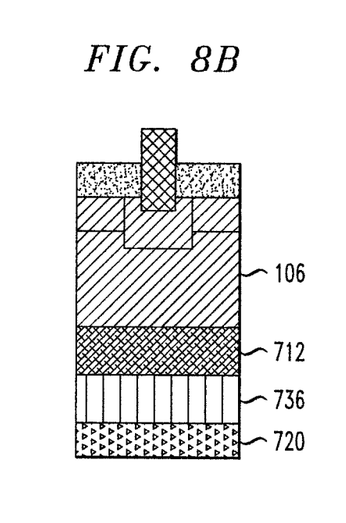
Figure 8C:
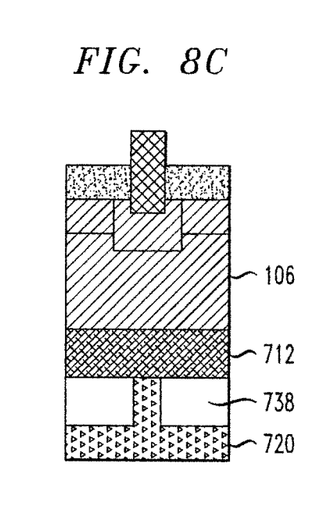

FIG. 8A through FIG. 8C include cross-section view diagrams illustrating examples of three different solar cell structures in which the large-area and/or blanket crystalline doped regions of the invention may be incorporated as blanket bsfs. Similar to the solar cells depicted in FIG. 5A through FIG. 5G, the solar cells of FIG. 8A through FIG. 8C are formed with p-type Si substrates 406, and have a generic front structure that includes a selective emitter with lightly doped n-type regions 422 and heavily doped n-type regions 424. The solar cells of FIG. 8A through FIG. 8C also include front ARC 426 and a finger/bus grid 428.

The structure of FIG. 8A has a blanket bsf 712 with a blanket metallic back contact layer 720 (for example, Al). The structure of FIG. 8B further includes a blanket reflector layer in the form of a transparent conductor layer 736 between the blanket bsf 712 and metallic back contact layer 720. The structure of FIG. 8C is similar to the structure of FIG. 8B, except for the substitution of a via-patterned (or line-patterned) transparent reflector layer 738 for blanket reflector layer 736. Patterning of transparent reflector layer 738 may be accomplished, for example, by pulsed laser processing similar to that shown in FIG. 2, or by conventional lithography and wet etching. Reflector layer 738, which typically includes one or more transparent dielectric layers, and reflector layer 736 have several functions. In addition to the reflection-enhancing function mentioned in connection with the FIG. 4 layers 472 and 474, reflector layers 736 and 738 can also reduce the back surface minority carrier recombination velocity because recombination at bsf/metal interface 712/720 is likely to be worse than at bsf/reflector interfaces 712/736 and 712/738.

Solar cell structures analogous to those shown in FIG. 8A through FIG. 8C may alternatively be fabricated with n-type Si substrates instead of the p-type Si substrates shown. In such instances, p-type blanket laser bsf 712 would be replaced with an n-type blanket laser bsf, and n-type emitter 422/424 would be replaced with a p-type emitter.

FIG. 9A through FIG. 9I include cross-section view diagrams illustrating an example process schematic for a process flow incorporating an example embodiment of the invention. Specifically, FIG. 9A through FIG. 9I depict an example process flow and structure for a cell that has a generic laser-doped selective emitter on the cell front and a localized laser bsf (produced via at least one embodiment of the invention) on the cell back. It should be noted and appreciated that the order of certain steps is not critical, and that other steps, shown or not shown, may be added, combined, substituted with other steps producing comparable function, or eliminated, depending on the final structure desired, as would be known to those skilled in the art.

Figure 9A:
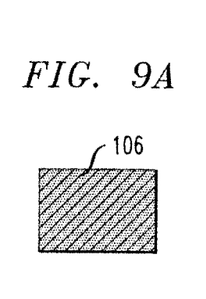
Figure 9B:
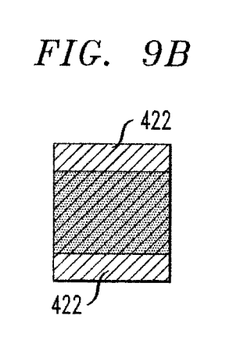
Figure 9C:
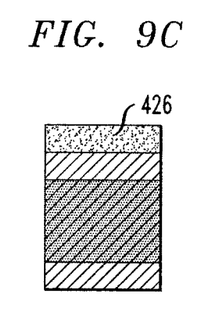
Figure 9D:
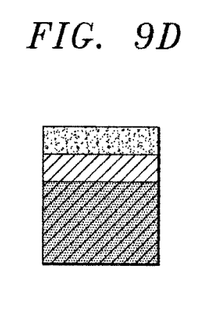
Figure 9E:
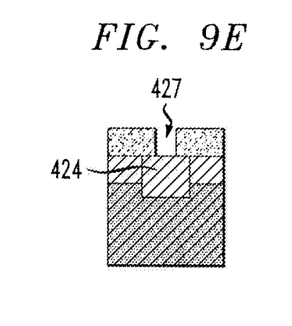

FIG. 9A through FIG. 9F depicts an initial portion of an example process flow, namely the steps for forming a solar cell front. FIG. 9A depicts selecting a p-type c-Si substrate 106. FIG. 9B depicts performing a $POCl_3$ diffusion to form a lightly-doped n-type emitter layers 422 and 422' on both sides of substrate 106. FIG. 9C depicts forming passivating ARC layer stack 426 (a layer of PECVD SiN, for example). FIG. 9D depicts removing the back surface emitter layer 422' (by a process such as etching in a solution of tetramethylammonium hydroxide (TMAH)). FIG. 9E depicts forming heavily doped selective emitter 424 and finger/grid openings 427 in passivating ARC layer stack 426, which may be accomplished by forming a n-type (for example, phosphorus) doping source layer (for example, a phosphosilicate glass (PSG), not shown) on ARC layer stack 426, irradiating the structure in selected regions with a patterned pulsed laser radiation to both locally diffuse the dopant and form finger/grid openings in the ARC layer stack, and then removing unreacted portions of the doping source layer. Further, FIG. 9F shows the structure of FIG. 9E after deposition of conductive front grid/bus structure 428.

Figure 9G:
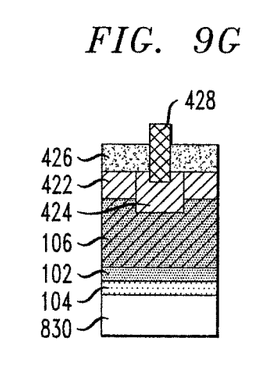
Figure 9H:
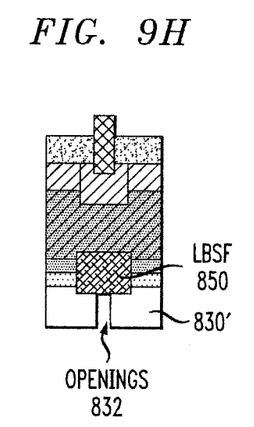
Figure 9I:
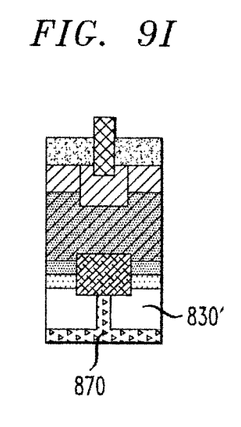

FIG. 9G through FIG. 9I show the steps of the example process flow particular to an embodiment of the invention, namely the steps that may be used to form a solar cell back that includes laser doped crystalline local bsf regions. FIG. 9G depicts forming a back surface p-type dopant-containing aSiH/reflector-barrier stack comprising i-aSiH layer 102, B-doped p-aSiH layer 104, and overlayer stack 830. Overlayer stack 830 is typically a transparent reflector/barrier layer 830 and may include, for example, a lower layer of PECVD SiN (15 nm) in contact with doped layer 104 and an upper layer of $PECVD SiO_2$ (100 nm).

Patterned laser irradiation is applied to the back of structure of FIG. 9G to form patterned overlayer stack 830' with openings 832 over heavily p-type doped localized bsf regions 850. The irradiation can, for example, be in a pattern of spaced-apart dots (for example, 50 μm diameter dots on a pitch of 1 millimeter mm), but can also be applied to form a pattern of spaced-apart lines. Additionally, a metallic back contact layer 870 (for example, Al) is deposited over patterned overlayer stack 830' and lbsf regions 850 to make the completed solar cell structure of FIG. 9I.

Exemplary fabrication conditions and materials characteristics of the laser doped regions of FIG. 1 through FIG. 5 will now be described in additional detail for two specific examples: (i) a rastered dot irradiation to form blanket laser bsf regions (such as might be performed on the structure of FIG. 6A), and (ii) a step and repeat dot irradiation to form localized laser bsf regions and overlayer patterning (such as might be performed on the structure of FIG. 2A). Both examples can utilize the same dopant-containing amorphous silicon layer stack 102/104 that includes i-aSiH layer 102 and B-doped p-aSiH layer 104, deposited at 250 C by PECVD using 13.56 MHz plasma excitation. The i-aSiH layer can be deposited by PECVD on an HF-last cleaned Si surface from a 1:10 mixture of $SiH_4$ and $H_2$ at a pressure of 8 Torr and the B-doped p-aSiH layer deposited on the i-aSiH from a 1:3.4:11 mixture of $SiH_4$, $B_2H_6$, and $H_2$ at a pressure of 4 Torr. The thickness of the i-aSiH layer can be, in this example, fixed at 10 nm whereas the thickness of the B-doped p-aSiH layer can be in a thickness range of 10 to 100 nm, with 20-50 nm being preferable.

For example (ii), the overlayer stacks can include one or more layers of $PECVD SiO_2$ and/or SiN, deposited at 250-400 C from mixtures of $SiH_4/N_2O$ or $SiH_4/N_2$, typically to a combined thickness in the range 80 to 110 nm. These layer stacks provide excellent passivation, with minority carrier lifetimes of 2-5 milliseconds (ms) measured (by microwave photoconductance) for p-type Czochralski-grown (CZ) Si wafers (surface orientation 100, resistivity 18 ohm-cm, thickness 720 µm) coated on both sides.

Additionally, patterned irradiation can be primarily provided by a diode pumped Q-switched laser providing irradiation to a ~40-50 µm diameter spot in 20-30 ns pulses at a repetition rate of 50-60 kHz, average powers of 4-13 W, and wavelengths of 532 or 1064 nm. By way of example, the laser spot position can be fixed and the sample mounted on a translation stage. For rastered samples (used to produce blanket bsfs), a sample stage can be scanned at 10 cm/sec in a back-and-forth pattern under the laser spot to draw parallel lines spaced apart by 40 µm, a procedure which provided lines of overlapping spots with a center-to-center spacing equal to the scan rate divided by the laser repetition rate (for example, 2 µm center-to-center spacing for a scan rate of 10 cm/sec and a repetition rate of 50 kHz). Samples to be patterned with spaced-apart dots (for localized bsfs) can be exposed in a step-and-repeat mode in which the sample is stationary while being exposed to a selected number of pulses (typically 5 to 20) before being moved for irradiation at the next spot location (typically 1 mm away). Example conditions can include wavelength 532 nm, 5-6 W average power, repetition rate 60 kHz, and scan rate 10 cm/sec for the scanned samples, and N=5 for the step-and-repeat samples.

Sheet resistance (Rs) measurements (4-point probe, after correction for substrate conductivity) for these rastered conditions on the CZ Si wafers described above can show, for example, approximately 9 ohm/sq for a 50 nm B-doped p-aSiH film, with the expected inverse Rs scaling with p-aSiH film thickness (for example, 25 ohm/sq for a p-aSiH film thickness of 20 nm). In one example, the Rs values were unaffected by the presence of the SiN and/or $SiO_2$ overlayers used. Secondary ion mass spectrometry (SIMS) analysis indicated the B concentration to be $6e21/cm^3$ in the as-deposited p-aSiH films. Also, after irradiation, the dopant profile was approximately box-like, with a depth of 0.5 µm and an average concentration of around $5e20/cm^3$.

While some above-described embodiments of the invention have focused on photovoltaic (PV) applications such as blanket laser BSF and localized laser BSF (dot pattern, lines, grids, etc.), blanket laser emitter and selective laser emitter embodiments of the invention (on either the front or back surface of a solar cell) are possible as well. By way of example, a selective laser emitter embodiment of the invention can be implemented on p-type substrates by forming a blanket crystalline n-type layer by $POCl_3$ diffusion, depositing a passivating n-type dopant-containing amorphous silicon layer stack and ARC overlayer on the blanket crystalline n-type layer, and patterning the amorphous silicon layer stack and ARC overlayer to form a heavily-doped crystalline selective emitter in a finger/grid pattern under openings in the ARC layer. Analogous embodiments may be implemented in n-type substrates with the substitution of layers with opposite doping types.

While the techniques described and illustrated above have been applied to standard homojunction crystalline Si solar cells (that is, non-HIT cells), embodiments of the invention can also be implemented in HIT cells as well. As described, for example, by M. Taguchi et al. in "HIT™ cells—high efficiency crystalline Si cells with novel structure" [Prog. Photovolt: Res. Appl. 8: 503-513 (2000)], HIT cells typically include an i-aSiH/doped-aSiH stack of one doping type on one side of a semiconductor substrate to function as a blanket emitter and an i-aSiH/doped-aSiH stack of opposite doping type on the opposite side of the substrate to function as a blanket back surface field. Both dopant stacks are coated with a transparent conductor and metallic finger/bus grid. As noted above, a challenge with HIT cells is the narrow process window for providing i-aSiH/doped-aSiH stacks with aSiH layers thick enough to provide good passivation yet thin enough to provide sufficient tunneling current to the back surface metallurgy.

In an embodiment of the invention, localized crystalline regions of high dopant concentration (and conductivity) may be created from the i-aSiH/doped-aSiH layer stacks already in the cell structure. These localized regions provide a parallel, high-conductivity path to the back surface metallurgy (typically, as noted above, a blanket layer of transparent conductor on which is disposed a metallic finger/grid pattern). In particular, such localized regions may be incorporated into the emitter side of a conventional HIT cell, the bsf side of a conventional HIT cell, or both the emitter and bsf sides of a conventional HIT cell. These localized regions may also be incorporated into the HIT side of hybrid HIT cells in which there is a HIT structure on one side of the cell and a conventional structure (for example the cell front structure of FIG. 5A through FIG. 5G) on the other side of the cell.

Figure 10A:
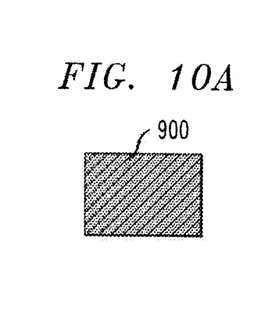
FIG. 10A through FIG. 10G are a mix of cross-section and plan-view diagrams illustrating an example process schematic for forming a HIT cell incorporating an example embodiment of the invention.
Figure 10B:
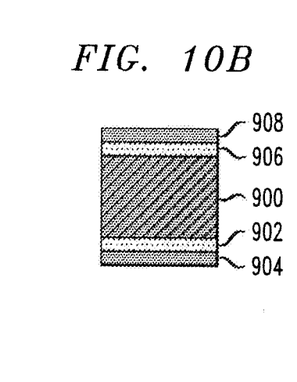
Figure 10C:
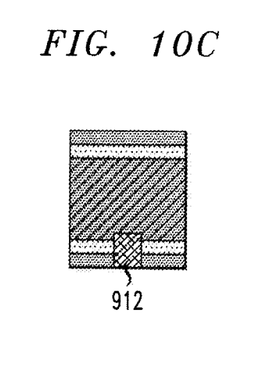

FIG. 10A through FIG. 10G include a mix of cross-section and plan-view diagrams illustrating an example process schematic for the particular case of forming a HIT-type solar cell incorporating the laser-doped crystalline regions of the invention as part of a bsf. Specifically, FIG. 10A depicts in cross-section view a starting p-type Si substrate 900. FIG. 10B depicts the structure of FIG. 10A after deposition of an i-aSiH/n-aSiH amorphous silicon stack 902/904 on an upper surface of p-type substrate 900 and an i-aSiH/p-aSiH stack 906/908 on a lower surface of p-type substrate 900, where the thicknesses of i-aSiH and doped aSiH layers are typically in the range 2-20 nm. FIG. 10C depicts the structure of FIG. 10B after laser patterned laser irradiation to form localized heavily doped crystalline p-type regions 912 on a back surface of substrate 900 (which may be a pattern of dots or grid lines, as indicated in the bottom plan view FIG. 10F and FIG. 10G).

Figure 10D:
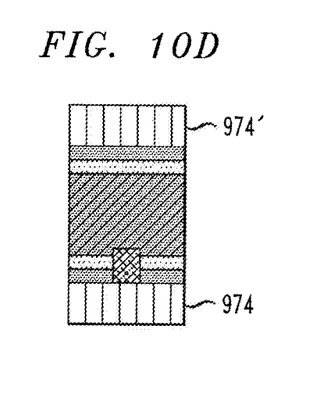
Figure 10E:
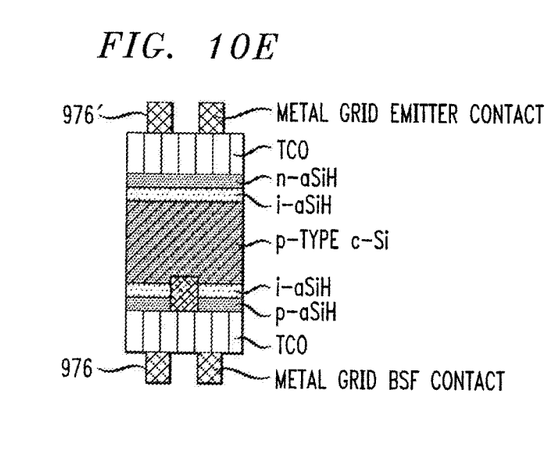
Figure 10F:
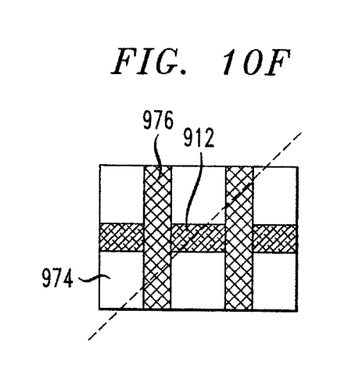
Figure 10G:
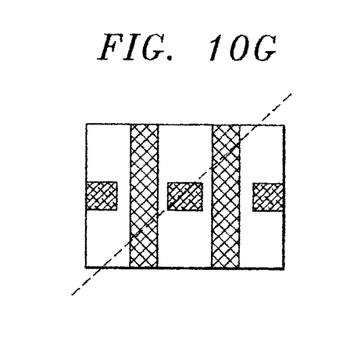

FIG. 10D depicts the structure of FIG. 10C after application of back and front transparent conductor layers 974 and 974'. The completed cell structure, formed by depositing back and front metallic grids 976 and 976' on the structure of FIG. 10D, is shown in FIG. 10E. It should be readily apparent to those skilled in the art how the process flows of FIG. 9A through FIG. 9I and FIG. 10A through FIG. 10E may be modified for fabricating any of the alternative HIT cell embodiments mentioned herein.

Figure 11:
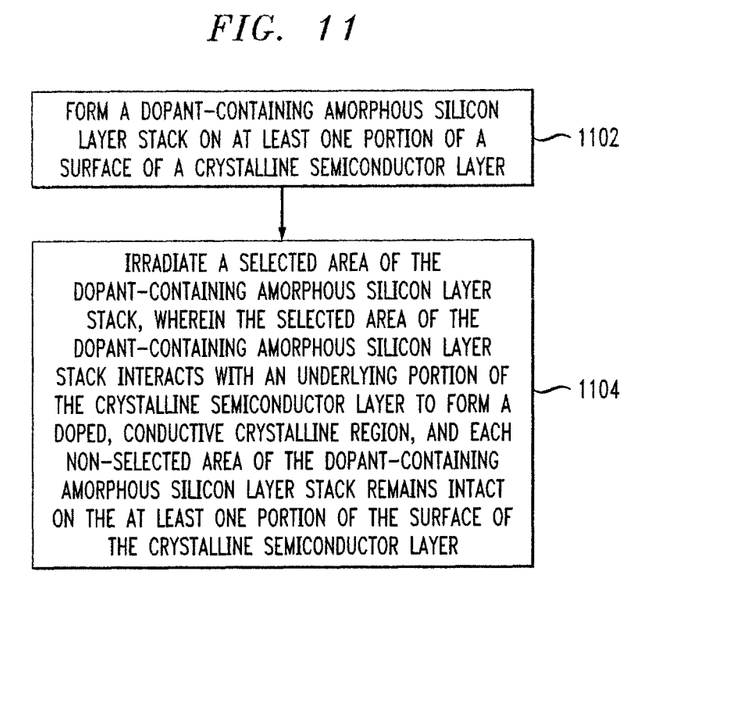
FIG. 11 is a flow diagram illustrating techniques for forming at least one doped, conductive crystalline region on a surface of a crystalline semiconductor layer, according to an embodiment of the present invention.

FIG. 11 is a flow diagram illustrating techniques for forming at least one doped, conductive crystalline region on a surface of a crystalline semiconductor layer (for example, a localized laser back surface field region of a solar cell), according to an embodiment of the present invention. Step 1102 includes forming a dopant-containing amorphous silicon layer stack (for example, a lower layer of undoped amorphous silicon providing a passivating function and an upper layer of doped amorphous silicon providing a dopant source function) on at least one portion of a surface of a crystalline semiconductor layer. The amorphous silicon layer stack, as detailed herein, includes a purely amorphous phase as well as an amorphous phase with embedded nanocrystalline and/or microcrystalline regions.

The forming step can include, for example, forming an i-aSiH(bottom)/p-aSiH(top) bi-layer on the portion of the surface of the crystalline base semiconductor layer, where the undoped (intrinsic) i-aSiH passivating layer may be 10 nm thick and the p-type dopant source layer p-aSiH may be a B-doped aSiH layer that is 10 to 50 nm thick.

Also, in another embodiment of the invention the B-doped aSiH layer can have a thickness of approximately 2-20 nanometers i-aSiH+10-50 aSiHB. Also, at least one embodiment of the invention can include forming a transparent layer or layer stack on the aSiH(bottom)/doped-aSiH(top) layer, as well as forming a conductive contact layer on the transparent layer stack. Further, at least one embodiment of the invention includes irradiating at least one selected area of the dopant-containing amorphous silicon layer stack to form at least one localized crystalline region of high doping concentration over which the transparent layer stack has been removed.

Additionally, the dopant-containing amorphous silicon layer stack can include a layer of undoped amorphous silicon providing a passivating function and a layer of doped amorphous silicon providing a dopant source function. The layer of undoped amorphous silicon and/or the layer of doped amorphous silicon can include a-SiH, a-Si(Ge)H, a-Ge(Si)H, and/or a-GeH, wherein H content varies from approximately 5% to approximately 50% atomic percent. Also, the layer of undoped amorphous silicon and/or the layer of doped amorphous silicon can additionally include carbon (C) and/or one or more dopants selected from a group including boron (B), phosphorous (P), arsenic (As), antimony (Sb), nitrogen (N), gallium (Ga), indium (In), and aluminum (Al).

Step 1104 includes irradiating at least one selected area of the dopant-containing amorphous silicon layer stack, wherein the dopant-containing amorphous silicon layer stack interacts with an upper portion of the underlying semiconductor layer to form a doped, conductive crystalline region in the at least one irradiated area. The irradiating step can include providing laser radiation to locally heat at least one selected area of the layer stack and one or more underlying base semiconductor layer regions. Additionally, the irradiating step can include irradiating at least one selected area of the silicon layer stack and one or more underlying base semiconductor layer regions to form at least one localized region of high doping concentration as well as a self-aligned opening in the overlayer stack above said localized crystalline region.

Additionally, the overlayer stack can include at least one metallic layer that is reflowed over one or more edges of said self-aligned opening to make contact with said localized crystalline region. Further, at least one embodiment of the invention includes forming a conductive contact layer over the overlayer stack and exposed localized crystalline regions remaining after irradiation.

The irradiating step can also include irradiating a pattern selected from a group including a blanket pattern, a grid pattern, a finger and/or bus pattern, and a spaced-apart dots pattern. The irradiating step is preferably provided by one or more pulses of a pulsed laser (pulse length <100 ns) so as to reduce thermal diffusion and bulk substrate heating.

The techniques depicted in FIG. 11 can also include forming a blanket transparent conductor layer over the dopant-containing amorphous silicon layer stack and localized crystalline regions remaining after irradiation, and forming a metallic conductor layer on the transparent conductor layer, wherein the metallic conductor has a grid pattern or a blanket pattern.

As detailed herein, the dopant-containing amorphous silicon layer stack remains intact in non-irradiated areas. The techniques depicted in FIG. 11 can additionally include selecting a p-type Si substrate. Further, at least one embodiment of the invention includes forming an overlayer above the dopant-containing amorphous silicon layer stack formed in step 1102. The overlayer can include a single or multilayer ARC or dielectric coating, a back reflector, a diffusion barrier, and/or a transparent conductor. After the irradiation of step 1104, the overlayer would include one or more openings self-aligned to the at least one doped, conductive crystalline region formed via said irradiating step.

Additionally, as described herein, at least one embodiment of the invention includes a structure that includes a crystalline semiconductor having at least one surface, a doped crystalline region disposed in at least one selected area of the semiconductor surface, and a dopant-containing amorphous silicon layer stack containing a same dopant as present in the doped crystalline region on at least a portion of the semiconductor surface outside the selected area, wherein the dopant-containing amorphous silicon layer stack passivates the portion of the semiconductor surface on which it is disposed. The structure can additionally include an overlayer formed above the silicon layer stack, wherein the overlayer includes a single or multilayer antireflection coating (ARC), a back reflector, a diffusion barrier, and/or a transparent conductor.

As detailed herein, such a structure can include a blanket layer of a metallic conductor disposed on the dopant-containing amorphous silicon layer stack and the doped crystalline region. Accordingly, such a structure can be one face of a solar cell structure. Additionally, at least one embodiment of the invention can also include a blanket layer of a transparent conductor disposed on the dopant-containing amorphous silicon layer stack and the doped crystalline region, and a metallic conductor layer disposed on the blanket layer of transparent conductor wherein the metallic conductor layer has a grid pattern or a blanket pattern. This particular structure can also be one face of a solar cell structure.

Further, a structure of at least one embodiment of the invention can include a patterned overlayer stack disposed on the dopant-containing amorphous silicon layer stack, wherein the patterned overlayer stack is patterned with at least one opening over the doped crystalline region, and a metallic conductor layer disposed over the patterned overlayer stack and doped crystalline region. The overlayer stack can include at least one of a single or multilayer dielectric coating, a back reflector, a diffusion barrier, a transparent conductor, and a metallic conductor. Such as structure can also be one face of a solar cell structure.

In such a structure, the dopant-containing amorphous silicon layer stack can include a layer of undoped amorphous silicon providing a passivating function and a layer of doped amorphous silicon providing a dopant source function. The layer of undoped amorphous silicon and/or the layer of doped amorphous silicon can include, as noted herein, one of a-SiH, a-Si(Ge)H, a-Ge(Si)H, and a-GeH, wherein H content varies from approximately 5 to approximately 50 atomic percent. Further, the layer of undoped amorphous silicon and/or the layer of doped amorphous silicon in such a structure can also include C and/or one or more dopants selected from a group including B, P, As, Sb, N, Ga, In, and Al.

Also, in at least one embodiment of the invention, the structure can include a conductive overlayer formed over the structure, and the structure can be one face of a solar cell structure.

It is also to be appreciated that all or portions of at least one embodiment of the present invention may be implemented in a wide variety of PV and non-PV devices, PV device geometries (including interdigitated back contact geometries, bifacial cell geometries, front surface field/emitter-on-the-back geometries, etc.), and PV fabrication schemes.

The resulting PV and non-PV devices may be distributed by the fabricator as to single cells or devices in raw form, as single cells or devices with packaging, or as single cells or devices in a multichip package that may include PV devices and components functionalities other than PV.

Figure 12:
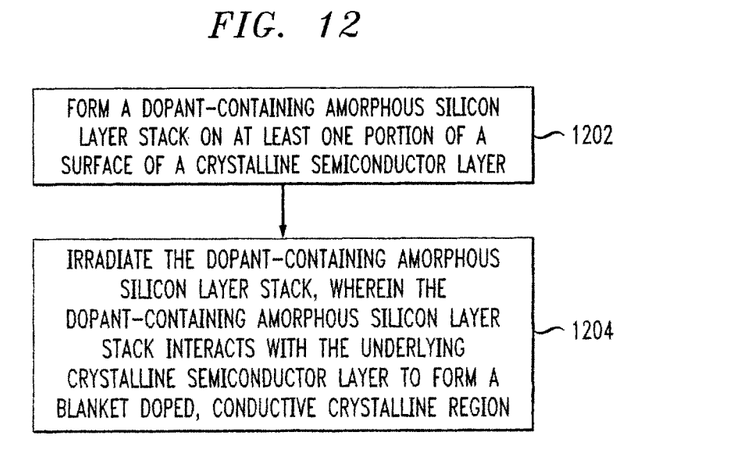
FIG. 12 is a flow diagram illustrating techniques for forming a doped, conductive crystalline region on a surface of a crystalline semiconductor layer, according to an embodiment of the present invention.

FIG. 12 is a flow diagram illustrating techniques for forming a doped, conductive crystalline region on a surface of a crystalline semiconductor layer (for example, a laser back surface field region of a solar cell), according to an embodiment of the present invention. Step 1202 includes forming a dopant-containing amorphous silicon layer stack on at least one portion of a surface of a crystalline semiconductor layer. The techniques depicted in FIG. 12 can additionally include selecting a p-type Si substrate.

Step 1204 includes irradiating the dopant-containing amorphous silicon layer stack, wherein the dopant-containing amorphous silicon layer stack interacts with the underlying crystalline semiconductor layer to form a blanket doped, conductive crystalline region. The irradiating step is preferably provided by one or more pulses of a pulsed laser (pulse length <100 ns) so as to heat the dopant-containing amorphous silicon layer stack with a minimum of bulk substrate heating.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure, comprising:
   a crystalline semiconductor having at least one surface;
   a doped crystalline region disposed in at least one selected area of the semiconductor surface;
   a dopant-containing amorphous silicon layer stack containing a same dopant as present in the doped crystalline region on at least a portion of the semiconductor surface outside the selected area, wherein the dopant-containing amorphous silicon layer stack passivates the portion of the semiconductor surface on which it is disposed; and
   a patterned overlayer stack disposed on the dopant-containing amorphous silicon layer stack, wherein the patterned overlayer stack is patterned with at least one opening over the doped crystalline region to physically expose one or more portions of the doped crystalline region to an outside environment.

2. The structure of claim 1, further comprising:
   a blanket layer of a metallic conductor disposed on the dopant-containing amorphous silicon layer stack and the doped crystalline region.

3. The structure of claim 2, wherein the structure comprises one face of a solar cell structure.

4. The structure of claim 1, further comprising:
   a blanket layer of a transparent conductor disposed on the dopant-containing amorphous silicon layer stack and the doped crystalline region; and
   a metallic conductor layer disposed on the blanket layer of transparent conductor wherein the metallic conductor layer has a grid pattern or a blanket pattern.

5. The structure of claim 4, wherein the structure comprises one face of a solar cell structure.

6. The structure of claim 1, further comprising:
   a metallic conductor layer disposed over said patterned overlayer stack and doped crystalline region.

7. The structure of claim 6, wherein the overlayer stack comprises at least one of a single or multilayer dielectric coating, a back reflector, a diffusion barrier, a transparent conductor, and a metallic conductor.

8. The structure of claim 6, wherein the structure comprises one face of a solar cell structure.

9. The structure of claim 1, wherein the dopant-containing amorphous silicon layer stack comprises an i-aSiH-bottom/doped-aSiH-top layer on the at least one surface of the crystalline semiconductor layer.

10. The structure of claim 1, wherein the dopant-containing amorphous silicon layer stack comprises (i) a lower layer of undoped amorphous silicon providing a passivating function and (ii) an upper layer of doped amorphous silicon providing a dopant source function.

11. The structure of claim 10, wherein the layer of undoped amorphous silicon and/or the layer of doped amorphous silicon comprise one of (i) a-SiH, (ii) a-Si(Ge)H, (iii) a-Ge(Si)H, and (iv) a-GeH.

12. The structure of claim 11, wherein H content varies from approximately 5% to approximately 50% atomic percent.

13. The structure of claim 10, wherein the layer of undoped amorphous silicon and/or the layer of doped amorphous silicon further comprises carbon (C) and/or a dopant selected from a group including boron (B), phosphorous (P), arsenic (As), antimony (Sb), nitrogen (N), gallium (Ga), indium (In), and aluminum (Al).

* * * * *